United States Patent

Ninomiya et al.

[19]

[11] Patent Number: 5,981,085
[45] Date of Patent: *Nov. 9, 1999

[54] COMPOSITE SUBSTRATE FOR HEAT-GENERATING SEMICONDUCTOR DEVICE AND SEMICONDUCTOR APPARATUS USING THE SAME

[75] Inventors: Junji Ninomiya, Imaichi; Akira Hideno, Koga; Takahiro Okada, Nikko, all of Japan

[73] Assignee: The Furukawa Electric Co., Inc., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/814,111

[22] Filed: Mar. 10, 1997

[30] Foreign Application Priority Data

Mar. 21, 1996 [JP] Japan .................................. 8-064187
Sep. 20, 1996 [JP] Japan .................................. 8-250629

[51] Int. Cl.$^6$ ............................ B32B 15/20; H01L 23/14
[52] U.S. Cl. ........................ 428/614; 428/620; 257/712; 361/710
[58] Field of Search .................................. 428/614, 610, 428/615, 621, 620, 654, 675; 257/706, 707, 712, 713, 717; 361/709, 710

[56] References Cited

U.S. PATENT DOCUMENTS

| | | | |
|---|---|---|---|
| 3,399,332 | 8/1968 | Savolainen | 428/621 |
| 4,961,106 | 10/1990 | Butt et al. | 357/74 |
| 5,039,577 | 8/1991 | Knoel et al. | 428/650 |
| 5,132,776 | 7/1992 | Hanada et al. | 357/81 |
| 5,259,436 | 11/1993 | Yun et al. | 164/97 |
| 5,526,867 | 6/1996 | Keck et al. | 164/97 |
| 5,533,257 | 7/1996 | Romero et al. | 29/890.03 |
| 5,570,502 | 11/1996 | Sawtell et al. | 29/527.6 |

*Primary Examiner*—John J. Zimmerman
*Attorney, Agent, or Firm*—Frishauf, Holtz, Goodman, Langer & Chick, P.C.

[57] ABSTRACT

A composite substrate on which a heat-generating semiconductor device is to be mounted, comprising a composite layer which includes a matrix made of a metal having a high thermal conductivity and a fibrous or particulate dispersion material having low thermal expansion properties present in the matrix, and a metal layer provided onto one main surface of the composite layer, wherein either one of a heat-generating semiconductor device or a substrate with low thermal expansion properties having a heat-generating semiconductor device provided thereon, is mounted on the other main surface of the composite layer.

7 Claims, 5 Drawing Sheets

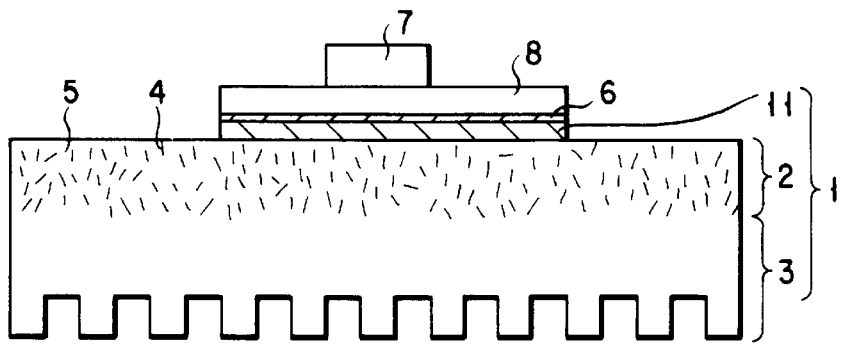
F I G. 13
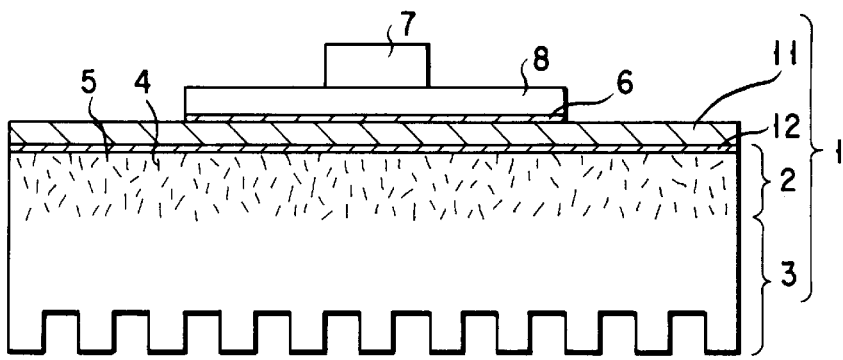
F I G. 14
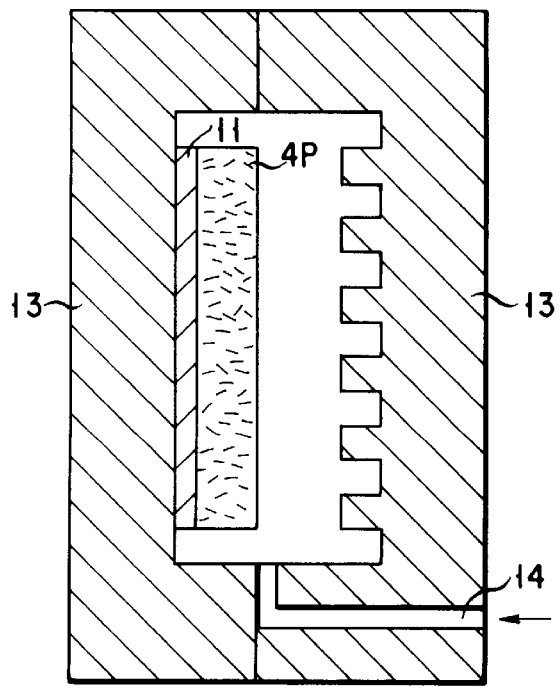
F I G. 15

COMPOSITE SUBSTRATE FOR HEAT-GENERATING SEMICONDUCTOR DEVICE AND SEMICONDUCTOR APPARATUS USING THE SAME

BACKGROUND OF THE INVENTION

The present invention relates to a composite substrate which has excellent heat-dissipating properties (or heat-absorbing properties) and is suitable for a substrate with a semiconductor device generating heat mounted thereon. The present invention also relates to a semiconductor apparatus employing the composite substrate.

Recently, with the development of large-scale semiconductor devices and the increase of the integration density, the amount of heat generated from the semiconductor devices has increased. To prevent thermal distortion, the substrate, on which the semiconductor device generating heat is mounted, (hereinafter, referred to as "heat-generating semiconductor device") must have a small thermal expansion coefficient close to that of the semiconductor device. To increase heat dissipation, the substrate must have an excellent thermal conductivity.

As a material for the substrate having a small thermal expansion coefficient, a ceramic material and a metal material are known. Examples of the ceramic material include alumina, Forstellite, mullite, and the like. Examples of the metal material include an Fe—Co alloy such as Koval, a Ni alloy such as 42 Alloy, and the like. However, these materials have a problem in that they have low thermal conductivities. On the other hand, as a material for the substrate having a high thermal conductivity, copper, copper alloys, aluminum, aluminum alloys and the like are generally known. However, these materials have a problem in that they have large thermal expansion coefficients.

Hence, the conventional semiconductor apparatuses employ a composite substrate which comprises a board having a small thermal expansion coefficient and a board having a good thermal conductivity, both being bonded with a solder having a low melting point. A heat-generating semiconductor device is usually mounted on the side of the board having a small thermal expansion coefficient of the composite substrate.

However, the conventional composite substrate has the following problems. Since the composite substrate is formed of two heterogeneous materials quite different in properties, high bonding strength is hardly obtained. Crackings or peelings are likely to take place at the bonding portion of the composite substrate when the bonding portion repeatedly receives thermal stress due to heat generation from the semiconductor device. As a result, the heat dissipation properties are deteriorated. Furthermore, since the board, on which the heat generating semiconductor device is mounted, is poor in thermal conductivity, the heat dissipation properties of the composite substrate is low.

BRIEF SUMMARY OF THE INVENTION

An object of the present invention is to provide a composite substrate, on which a heat-generating semiconductor device is to be mounted, and which has excellent heat dissipation properties with rare occurrence of cracking and peeling due to thermal stress.

Another object of the present invention is to provide a semiconductor apparatus comprising the composite substrate, on which a heat-generating semiconductor device is mounted, and which has good heat dissipation properties with rare occurrence of crackings and peeling due to thermal stress.

According to the present invention, there is provided a composite substrate on which a heat-generating semiconductor device is to be mounted, which comprises:

a composite layer containing a matrix made of a high-thermal-conductivity metal and a fibrous or particulate dispersion material formed of a low-thermal-expansion substance dispersed in the matrix; and a metal layer provided onto one main surface of the composite layer;

wherein either one of a heat-generating semiconductor device and a low-thermal expansion-substrate provided with a heat-generating semiconductor device, is mounted on another main surface of the composite layer.

According to the present invention, there is provided a composite substrate on which a heat-generating semiconductor device is to be mounted, which comprises:

a composite layer containing a matrix made of a high-thermal-conductivity metal and a fibrous or particulate dispersion material formed of a low-thermal-expansion substance contained in the matrix; and a metal layer provided onto one main surface of the composite layer;

wherein the metal layer is made of a metal identical to that constituting the matrix, the metal layer and the matrix form a continuous phase, and either one of a heat-generating semiconductor device and a low-thermal-expansion substrate provided with a heat-generating semiconductor device, is mounted on another main surface of the composite layer.

According to the present invention, there is provided a composite substrate on which a heat-generating semiconductor device is to be mounted, which comprises:

a composite layer including a matrix made of a high-thermal-conductivity metal and a low-thermal-expansion fibrous or particulate dispersion material contained in the matrix; and a metal layer formed on one main surface of the composite layer;

wherein the metal layer, which is formed of a metal identical or analogous to that used in the matrix, is bonded to the composite layer together, and either one of a heat-generating semiconductor device and a low-thermal-expansion substrate provided with a heat-generating semiconductor device, is mounted on another main surface of the composite layer.

According to the present invention, there is provided a semiconductor apparatus comprising the aforementioned composite substrate on which either one of a heat-generating semiconductor device and a low-thermal-expansion substrate provided with the heat-generating semiconductor device, is mounted on the main surface of the composite layer not facing the metal layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13 is a cross-sectional view of a composite substrate on which a heat-generating semiconductor device is to be mounted, and a semiconductor apparatus provided with the composite substrate, according to Embodiment 10 of the present invention.

FIG. 14 is a cross-sectional view of a composite substrate on which a heat-generating semiconductor device is to be mounted, and a semiconductor apparatus provided with the composite substrate, according to Embodiment 11 of the present invention.

FIG. 15 is a view for use in explaining a method of bonding a metal plate with a composite layer by casting under pressure.

DETAILED DESCRIPTION OF THE INVENTION

Figure 1:
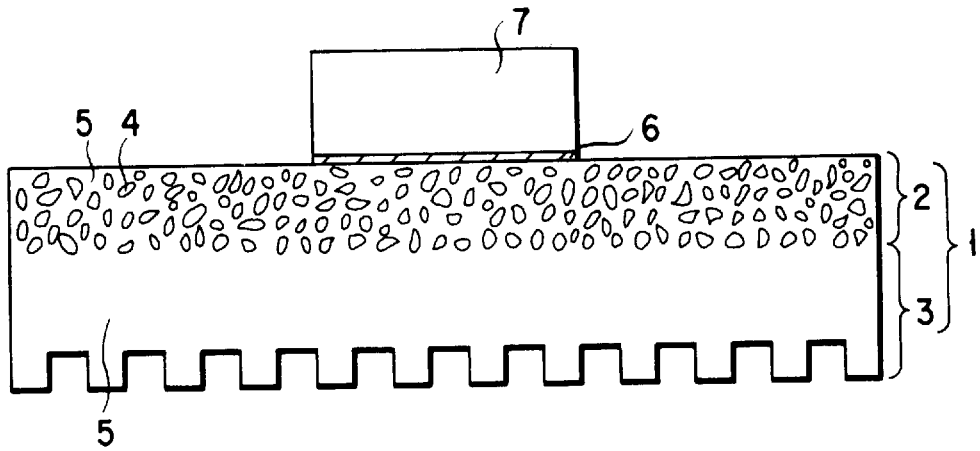
FIG. 1 is a cross-sectional view of a composite substrate on which a heat-generating semiconductor device is to be mounted, and a semiconductor apparatus provided with the composite substrate, according to Embodiment 1 of the present invention.

The composite substrate, on which a heat-generating semiconductor device is to be mounted, of the present invention, comprises a composite layer and a metal layer formed on one main surface of the composite layer. The composite layer contains a matrix made of a metal having a high thermal conductivity and a fibrous or particulate dispersion material having a low thermal expansion property dispersed in the matrix.

Since the dispersion material having a low thermal expansion property is dispersed in the metal matrix in the composite layer constituting the composite substrate of the present invention, it is possible to approximate the thermal expansion coefficient of the composite substrate to that of the semiconductor device. Therefore, excessive stress will not be applied to the bonding portion of the composite substrate to a heat-generating semiconductor device (or to a substrate with poor thermal expansion properties, provided with a heat generating semiconductor device). As a result, the reliability of the semiconductor apparatus can be enhanced.

In the case where the metal matrix and the metal layer are formed of the same metal having a high thermal conductivity in an continuous phase without anything interposed therebetween, the thermal conductivity within the composite substrate is quite excellent. Therefore, excellent heat dissipating properties can be obtained and cracking and peeling will rarely take place within the composite substrate.

In another case where the metal layer is formed of the same metal or a metal of the same series as that used in the metal matrix of the composite layer, and both layers are bonded with solder or by welding, the bonding strength between the metal layer and the composite layer can be improved and cracking and peeling will rarely take place within the composite substrate, since the metal layer and the metal matrix of the composite layer are made of a same or similar metal. Similarly to the former case (in which the metal matrix and the metal layer form a continuous phase), excessive stress will not be applied to the bonding portion of the composite substrate to a heat-generating semiconductor device. Hence, the reliability of the semiconductor apparatus can be enhanced.

In the latter case, when the composite layer is soldered to the metal layer, deformation such as warpage due to thermal stress may take place because the thermal expansion coefficients of both layers differ. In such a case, the composite layer and the metal layer are not necessarily arranged contiguously in the thickness direction. To explain more specifically, only the composite layer is present in the thickness direction in some portions, whereas the composite layer and the metal layer may be present contiguously in other portions. Hence, the metal layer may be present in a discrete form. In this way, it is possible to reduce the total bonded area between the composite layer and the metal layer. As an extreme case, a metal layer of a pin-form may be directly connected to the composite layer.

In the composite layer thus constructed, warpage does not occur when the metal layer is bonded to the composite layer.

Furthermore, if projections and depressions are formed on the surface of the discrete-form metal layer which are connected only by way of the composite layer, improvement of heat dissipation can be expected. Since warpage of the composite substrate due to heat history at bonding will be suppressed by such modifications, the bonding can be performed by braze-bonding using an Al—Si base brazing material (for example, BA4343, BA4045), if necessary.

When either a heat-generating semiconductor device or a substrate with poor thermal expansion properties, provided with a heat-generating semiconductor device, is mounted with soldering on the composite layer of the composite substrate mentioned above, the composite layer will exhibits poorer soldering properties due to the presence of dispersion material, than a metal layer containing no dispersion material. In particular, the composite layer made of an Al-base matrix containing a dispersion material is poor in soldering properties. Hence, even though no cracking and peeling take place within the composite substrate, they may take place at the soldering portion between the composite layer and a heat-generating semiconductor device or the substrate (poor thermal expansion) having a heat-generating semiconductor device mounted thereon, due to the poor soldering properties.

To overcome the aforementioned problems, a metal film or a metal plate having good soldering properties may be provided onto the surface of the composite layer of the composite substrate on which a heat-generating semiconductor device is to be mounted.

The presence of the metal film or the metal plate makes it possible to improve the soldering properties of the composite layer to the heat-generating semiconductor device or to the substrate (poor thermal expansion) having the heat-generating semiconductor device mounted thereon, and to lower the occurrence of cracking and peeling at the soldering portion between the substrate and the device.

Hereinbelow, Embodiments of the present invention will be explained with reference to the drawings.

Embodiment 1

FIG. 1 is a schematic view of a composite substrate on which a heat-generating semiconductor device is to be mounted, and a semiconductor apparatus provided with the composite substrate, according to the first embodiment of the present invention. In FIG. 1, reference numeral 1 denotes a composite substrate on which a heat-generating semiconductor device is to be mounted. Numeral 7 denotes a heat-generating semiconductor device. The composite substrate 1 comprises a composite layer 2 and a metal layer 3 laminated in a thickness direction. In other words, the composite layer 2 constitutes part of the composite substrate 1 in the thickness direction. The thickness of the composite layer 2 is preferably from 1–20 mm. The thickness of the metal layer 3 is preferably selected according to the output of the semiconductor device 7 mounted on the composite substrate 1.

The composite layer 2 is composed of a metal matrix 5 with high thermal conductivity and a dispersion material 4 with poor thermal-expansion properties dispersed in the matrix. The size of the fibrous dispersion material 4 preferably falls in the ranges of 0.1–100 $\mu$m in diameter, and 20 $\mu$m or more in length. The volume filling ratio of the dispersion material 4 contained in the composite substrate is preferably in the range of 10–70%.

In this embodiment, the metal layer 3 is composed of the same metal as that used in the metal matrix 5 of the composite layer 2. The metal layer 3 is contiguous to the metal matrix 5 of the composite layer 2 with no material interposed therebetween.

The heat-generating semiconductor device 7 is bonded to the composite layer 2 with solder 6. Heat generated from the semiconductor device 7 is dissipated by passing through the composite layer 2 and the metal layer 3. In the composite layer, the vacant spaces between particles or fibers of the dispersion material 4 are filled with the metal matrix 5 having an excellent thermal conductivity to form a continuous sponge-form. Therefore, the composite layer 2 has an excellent thermal conductivity. The metal layer 3 is formed contiguously to the metal matrix 5 of the composite layer 2. Therefore, the thermal conductivity between them is excellent. The thermal conductivity within the metal layer 3 is also satisfactory.

According to the composite substrate 1 of the present invention, quite excellent heat dissipating properties can be obtained. Since the composite layer 2 contains the dispersion material 4 having poor thermal expansion properties, the composite layer 2 has considerably poor thermal expansion properties than the layer made of metal alone. Therefore, the thermal expansion properties of the composite layer 1 can be approximated to that of the semiconductor device 7. Hence, even if the temperature of the semiconductor device 7 changes, excessive stress may not be applied to the bonding portion of the semiconductor device 7 and the composite layer 2.

Then, to increase heat dissipation, it is desired to provide projections and depressions to the surface (outer surface) of the metal layer 3, as shown in the figure. Alternatively, the surface of the metal layer 3 may be formed flat.

As the material constituting the metal layer 3 and the metal matrix 5 of the composite layer 2, copper, copper alloys, aluminum, or aluminum alloys may be appropriately used.

As the dispersion material 4 constituting the composite layer 2, ceramic materials, metal materials, and intermetallic compounds may be used. Examples of the ceramic materials include $Al_2O_3$, mullite, AlN, SiC, $SiO_2$, $ZrO_2$, $Si_3N_4$, $TiB_2$, $ZrB_2$, $9Al_2O_3.B_2O_3$, $K_2Ti_6O_{18}$, C and the like. Examples of metal materials include an Invar alloys, shape memory alloys, W, Mo, Si, and the like. Examples of intermetallic compounds include $Ni_3Al$, $Nb_3Al$, $FeAl3$, and the like.

These dispersion materials may be used in the form of fibers or particles (powders). The dispersion materials may be appropriately chosen depending on required specification, i. e., cost, thermal expansion coefficient, thermal conductivity, and electric properties. Depending on required characteristics, the dispersion materials may be used alone or in combination of two or more materials. The thermal conductivity and thermal expansion coefficient of the composite layer may be controlled by varying the volume filling ratio of the dispersion material contained in the composite layer.

Although it is not shown in the figure, an insulating layer may be provided on the composite substrate, more specifically, on that surface of the composite substrate on which a heat-generating semiconductor device is to be mounted. If the semiconductor device is required to be electrically isolated from the substrate, an insulating layer must be provided onto the composite substrate since the composite layer of the composite substrate is conductive. If the insulating layer is provided, a circuit pattern can be formed on the surface thereof. As a material for the insulating layer, glass epoxy may be used. When the metal matrix 5 is made of Al or Al alloy, alumite film may be used as the insulating layer.

The filling ratio of the dispersion material contained in the composite layer is preferably highest at the surface thereof and gradually decreases toward the inside. In this manner, the thermal expansion coefficient near the surface of the composite layer can be easily approximated to that of the semiconductor device and the thermal conductivity within the composite substrate can be further increased.

When the fiber-form dispersion material is used, it is preferable that the dispersion material is oriented in the direction of suppressing the thermal expansion. The thermal expansion of the composite layer can be efficiently decreased by this arrangement.

Embodiment 2

Figure 2:
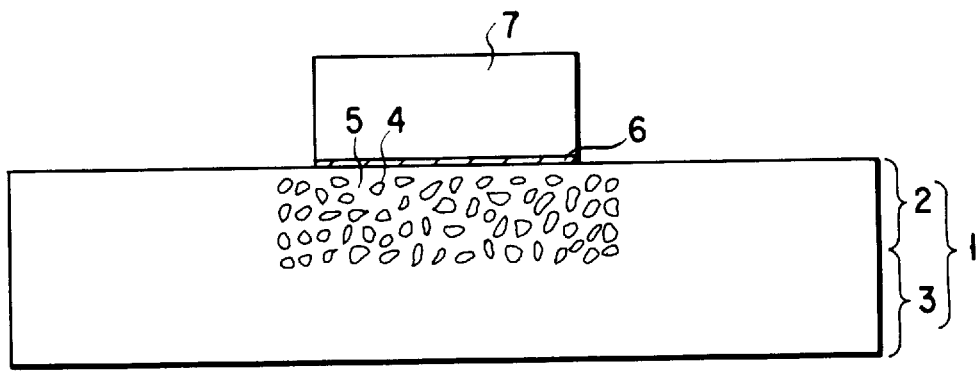
FIG. 2 is a cross-sectional view of a composite substrate on which a heat-generating semiconductor device is to be mounted, and a semiconductor apparatus provided with the composite substrate, according to Embodiment 2 of the present invention.

FIG. 2 is a schematic view of a composite substrate on which a heat-generating semiconductor device is to be mounted, and a semiconductor apparatus provided with the composite substrate, according to the second embodiment of the present invention. In the embodiment shown in FIG. 1, the composite layer 2 is present on the entire region of one surface of the composite substrate. Whereas in the embodiment shown in FIG. 2, the composite layer 2 is present in the form of an island in the portion on which the heat-generating semiconductor device 7 is mounted. Alternatively, the composite layer 2 may be present in the form of a band extending through the area on which the semiconductor device 7 is mounted. The island-form or band-form composite layer 2 is rather advantageous in view of cost performance since the amount of the dispersion material used can be saved while maintaining good heat dissipation properties.

In FIG. 2, the same reference numerals are used to designate the same structural members corresponding to those shown in FIG. 1. Any further explanation is omitted since the structural members and materials used therein and modifications thereof excluding those mentioned above, are the same as those of Embodiment 1.

Embodiment 3

Figure 3:
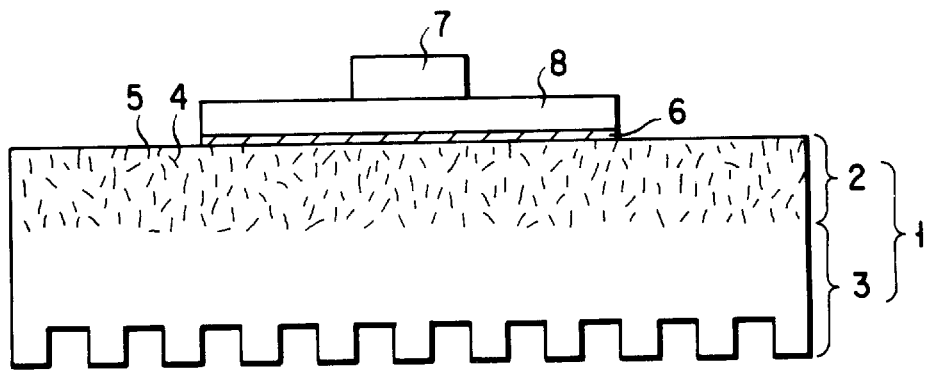
FIG. 3 is a cross-sectional view of a composite substrate on which a heat-generating semiconductor device is to be mounted, and a semiconductor apparatus provided with the composite substrate, according to Embodiment 3 of the present invention.

FIG. 3 is a schematic view of a composite substrate on which a heat-generating semiconductor device is to be mounted, and a semiconductor apparatus provided with the composite substrate, according to the third embodiment of the present invention. In the embodiment shown in FIG. 1, the heat-generating semiconductor device 7 is directly soldered onto the composite layer 2. Whereas, in the embodiment shown in FIG. 3, a substrate 8 having the heat-generating semiconductor device 7 mounted thereon, is bonded with a solder 6 onto the composite layer 2. The substrate 8 used herein has poor thermal expansion properties. As the substrate 8, for example, DBC (direct bonding copper) substrate is used, which is an alumina plate having copper layers provided on both sides.

In FIG. 3, the same reference numerals are used to designate the same structural members corresponding to those shown in FIG. 1. Any further explanation is omitted since other structural members and materials used herein and modifications thereof excluding those mentioned above, are the same as those of Embodiment 1.

As the composite substrate 1, the substrate formed as shown in FIG. 2 may be employed herein.

Embodiment 4

Figure 4:
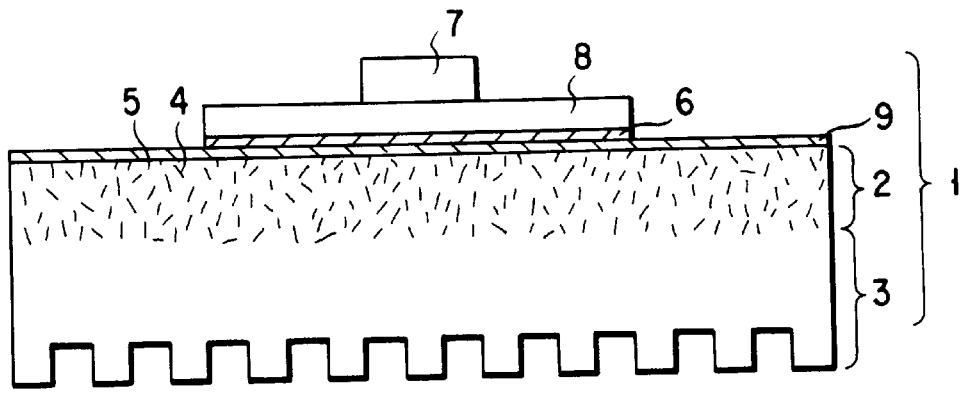
FIG. 4 is a cross-sectional view of a composite substrate on which a heat-generating semiconductor device is to be mounted, and a semiconductor apparatus provided with the composite substrate, according to Embodiment 4 of the present invention.

FIG. 4 is a schematic view of a composite substrate on which a heat-generating semiconductor device is to be mounted, and a semiconductor apparatus provided with the composite substrate, according to the fourth embodiment of the present invention. In this embodiment, a metal film 9 having good soldering properties is provided over the surface of the composite layer 2. On the metal film 9, a substrate 8 (with poor thermal expansion properties) having the heat-generating semiconductor device 7 mounted thereon, is bonded with a solder 6. As the material for the metal film 9, Cu, Ni, Pd, Sn, Au, Ag, or the like may be used.

The composite layer 2 is inferior in soldering properties since it contains the dispersion material 4. However, if the metal film 9 is provided on the surface of the composite layer 2, the soldering properties of the composite layer 2 can be improved. In addition, the metal film 9 contributes to preventing the cracking and peeling due to thermal stress at the soldering portion. In the case where the metal matrix 5 of the composite layer 2 is made of aluminum or an aluminum alloy, it is particularly preferable to employ the structure shown in FIG. 4.

The metal film 9 may be a single layer or a laminate structure consisting of at least two layers made of the aforementioned materials depending on requirements.

Figure 5:
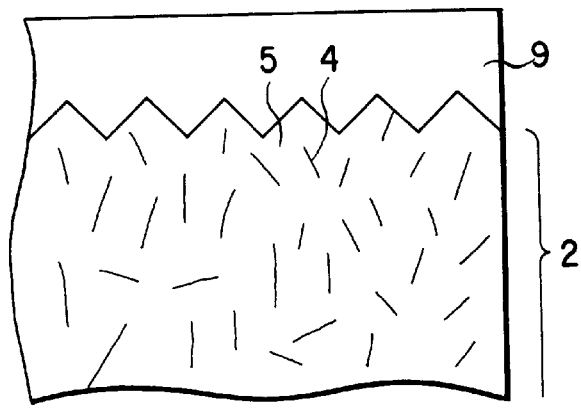
FIG. 5 is a cross-sectional view of a preferred example of the bonding portion of the composite layer and the metal film of the composite substrate shown in FIG. 4.

The metal film 9 may be formed by means of plating or the like. To improve the adhesion of the composite layer 2 to the metal film 9, it is better to provide projections and depressions to the surface of the composite layer 2, as shown in FIG. 5, followed by providing the metal film 9 thereon.

Figure 6:
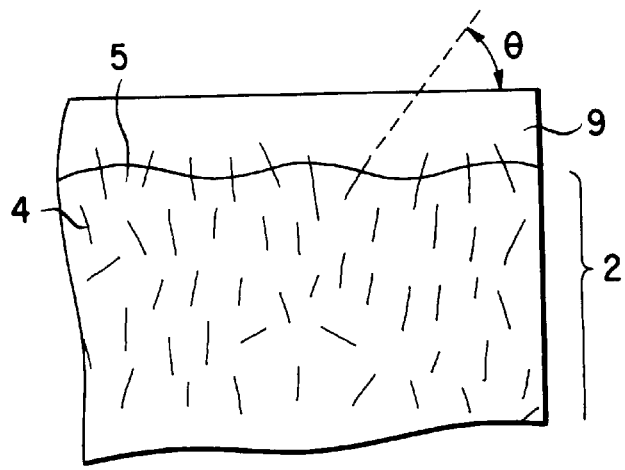
FIG. 6 is a cross-sectional view of another preferred example of the bonding portion of the composite layer and the metal film of the composite substrate shown in FIG. 4.

To improve the adhesion of the composite layer 2 to the metal film 9, the following method may be effective. In this method, some portions of the dispersion material 4 are allowed to protrude from the surface of the composite layer 2, as shown in FIG. 6, followed by forming the metal film 9 thereon. Since the protruding portions of the dispersion material 4 eat into the metal film 9, the adhesion is ensured. Such a structure can be obtained by etching the surface of the metal matrix 5 of the composite layer 2 to a depth of 5 to 50 μm and then forming the metal film 9 having good soldering properties over the etched surface in a thickness larger than the etching depth. The structure shown in FIG. 6 can be obtained by dispersing a fibrous-form dispersion material 4 in such a manner that at least 50% of the dispersion material 4 is oriented in the direction with an angle (θ) of 30–90° to the surface of the metal film 9.

In FIG. 4, the same reference numerals are used to designate the same structural members corresponding to those shown in FIG. 1. Any further explanation is omitted since the structural members and materials used herein and modifications thereof excluding those mentioned above are the same as those of Embodiment 1.

The composite substrate 1 as shown in FIG. 2 may be employed herein. The heat-generating semiconductor device 7 used herein may be soldered directly onto the surface of the metal film 9.

Embodiment 5

Figure 7:
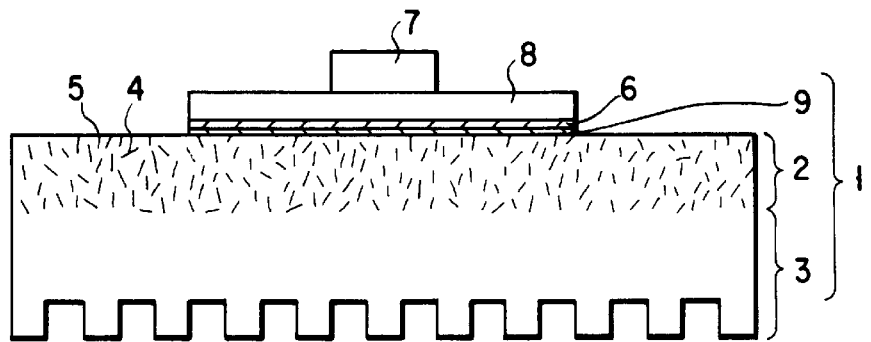
FIG. 7 is a cross-sectional view of a composite substrate on which a heat-generating semiconductor device is to be mounted, and a semiconductor apparatus provided with the composite substrate, according to Embodiment 5 of the present invention.

FIG. 7 is a schematic view of a composite substrate on which a heat-generating semiconductor device is to be mounted, and a semiconductor apparatus provided with the composite substrate, according to the fifth embodiment of the present invention. In this embodiment, a metal film 9 having good soldering property is provided in the form of an island or a band at the surface region of the composite layer 2 on which the substrate 8 having the heat-generating semiconductor device 7 mounted thereon, is to be soldered.

In FIG. 7, the same reference numerals are used to designate the same structural members corresponding to those in Embodiment 4 shown in FIGS. 4–6. Any further explanation is omitted since the structural members and materials used herein and modifications excluding those mentioned above are the same as those of Embodiment 4.

Embodiment 6

Figure 8:
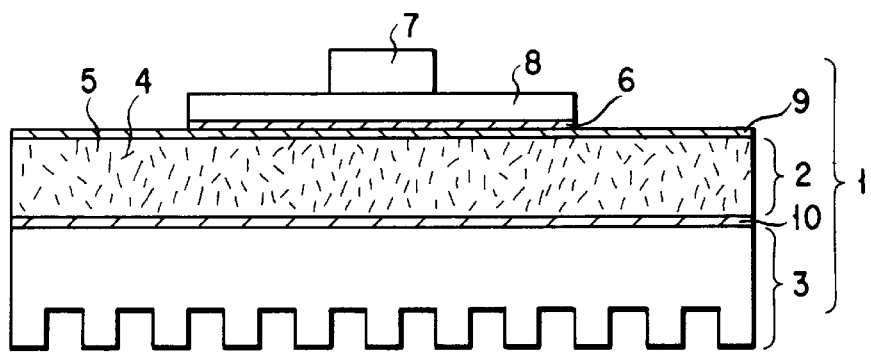
FIG. 8 is a cross-sectional view of a composite substrate on which a heat-generating semiconductor device is to be mounted, and a semiconductor apparatus provided with the composite substrate, according to Embodiment 6 of the present invention.

FIG. 8 is a schematic view of a composite substrate on which a heat-generating semiconductor device is to be mounted, and a semiconductor apparatus provided with the composite substrate, according to the sixth embodiment of the present invention. In this embodiment, the substrate 1 on which the heat-generating semiconductor device is to be mounted, is constituted by a composite layer 2 and a metal layer 3, which are bonded to each other with a solder layer 10 interposed therebetween. With this structure, the thermal conductivity of the composite substrate 1 in the thickness direction decreases, compared to the case where the composite layer 2, the metal matrix 5, and the metal layer 3 constitute a continuous phase. However, if the thickness of the solder layer 10 is reduced to, for example, about 0.1 to 0.4 mm, sufficient heat dissipating properties can be obtained.

In the composite substrate of this embodiment, the metal layer 3 is made of the same metal or a metal of the same series as that used in the metal matrix 5 of the composite layer 2 in order to ensure the bonding by means of the solder layer 10 and to prevent the cracking and peeling at the bonding face due to thermal stress. For example, in the case where the metal matrix 5 of the composite layer 2 is made of Al or an Al alloy, the metal layer 3 should be made of Al or an Al alloy. To bond the composite layer 2 to the metal layer 3, an Sn—Zn solder usually employed in aluminum bonding, is used.

In this embodiment, the metal film 9 having good soldering properties is formed on the surface of the composite layer 2. The substrate 8 with the heat-generating semiconductor device 7 mounted thereon is bonded to the metal film 9 with solder 6. In this respect, any further explanation is omitted since the construction is the same as that of Embodiment 4 shown in FIGS. 4 to 6. The metal film 9 may be provided partially as is shown in FIG. 7 (Embodiment 5). Furthermore, the heat-generating semiconductor device 7 may be directly solder-bonded either to the metal film 9 or to the composite layer 2 without providing the metal film 9. Any further explanation is omitted since the structure and materials used therein and modifications except those mentioned above are the same as those of Embodiment 1.

Embodiment 7

Figure 9:
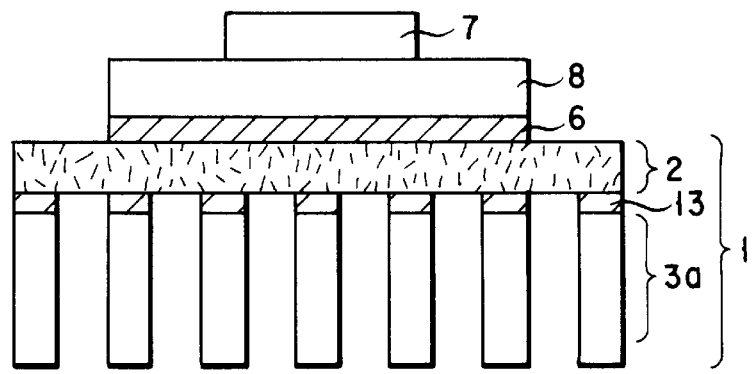
FIG. 9 is a cross-sectional view of a composite substrate on which a heat-generating semiconductor device is to be mounted, and a semiconductor apparatus provided with the composite substrate, according to Embodiment 7 of the present invention.

FIG. 9 is a schematic view of a composite substrate on which a heat-generating semiconductor device is to be mounted, and a semiconductor apparatus provided with the composite substrate, according to the present invention. In this embodiment, a composite substrate 1 on which a heat-generating semiconductor device is to be mounted, is formed of a composite layer 2 and a metal layer 3. The entire composite layer 2 is not in contact with the metal layer 3. To be more specific, the discrete metal layers 3a are partially formed on the rear surface of the composite layer 2.

Accordingly, in some portions of the composite substrate, only the composite layer 2 is present in the thickness direction. In other portions, both composite layer 2 and the isolated metal layers 3a are present in a continuous form in the thickness direction. With the structure mentioned above, the area of the bonding surface of the composite layer 2 in contact with the metal layer 3a can be reduced.

This structure is also effective to reduce the thermal stress ascribed to the difference in thermal expansion rate between the metal layers 3a and the composite layer 2 when the metal layers 3a are bonded to the composite layer 2. Consequently, distortion of the composite substrate 1 due to warpage can be prevented.

Figure 10:
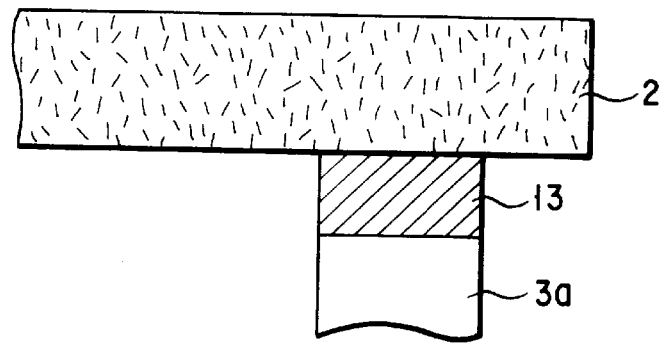
FIG. 10 is an enlarged cross-sectional view of the joint of the composite layer and the metal film forming the composite substrate shown in FIG. 9.

Since the thermal stress between the composite layer 2 and the metal layers 3a is suppressed, the composite layer 2 can be bonded to the metal layers 3a with solder 13, as shown in the enlarged view of FIG. 10. Alternatively, the bonding may be made at relatively high temperatures by use of e.g. an Al—Si base blazing material (such as BA4343, A4045). In this case, a solder having a higher melting point can be used when other structural members are attached. Therefore, fabrication of the semiconductor apparatus can be carried out with high degree of freedom.

Alternatively, if solder or a brazing material is applied to the surface of the composite layer 2 to be bonded to the metal layers 3a, and discrete metal layers 3a are fixed all together to the composite layer 2 by use of a tool, and bonded thereto, the mass production of the composite substrate can be attained. To facilitate the bonding in this embodiment, a metal film (not shown in FIG. 9) may be formed on the surface of the composite layer 2.

Embodiment 8

Figure 11:
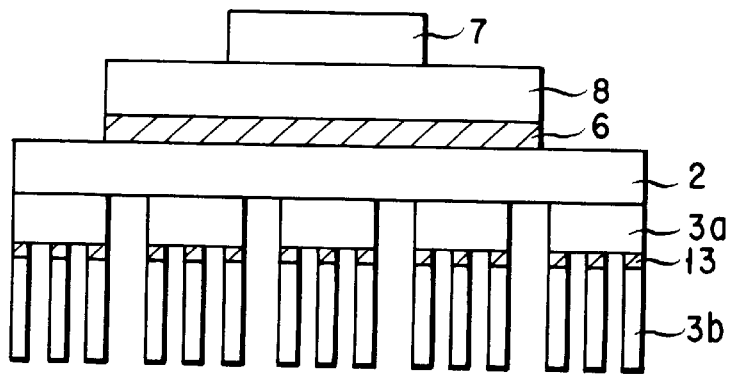
FIG. 11 is a cross-sectional view of a composite substrate on which a heat-generating semiconductor device is to be mounted, and a semiconductor apparatus provided with the composite substrate, according to Embodiment 8 of the present invention.

FIG. 11 is a schematic view of a composite substrate on which a heat-generating semiconductor device is to be mounted, and a semiconductor apparatus provided with the composite substrate. In this embodiment, discrete metal layers 3b are further bonded to the surface of each of the metal layers 3a shown in Embodiment 7. In this manner, projection and depressions are provided. With the structure having the metal layers 3a and 3b, the surface area of the metal layer increases. Consequently, the heat dissipation is improved.

Incidentally, the metal layers 3b are bonded to the metal layers 3a with solder 13 in the Embodiment of FIG. 11. However, the metal layers 3b may be formed by machining the metal layers 3a.

Also in this embodiment, a metal film (not shown in FIG. 11) may be formed on the surface of the composite layer 2 to facilitate the bonding.

Any further explanation is omitted since the structure and materials used therein and modifications thereof are the same as those of Embodiment 1.

Embodiment 9

Figure 12:
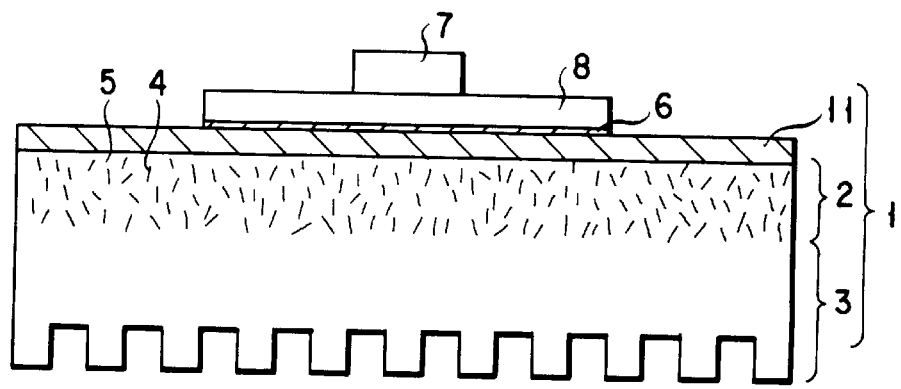
FIG. 12 is a cross-sectional view of a composite substrate on which a heat-generating semiconductor device is to be mounted, and a semiconductor apparatus provided with the composite substrate, according to Embodiment 9 of the present invention.

FIG. 12 is a schematic view of a composite substrate on which a heat-generating semiconductor device is to be mounted, and a semiconductor apparatus provided with the composite substrate, according to the ninth embodiment of the present invention. In this embodiment, a metal plate 11 having good soldering properties is bonded on the surface of a composite layer 2. On the metal plate 11, a substrate 8 (having poor thermal expansion properties) on which a heat-generating semiconductor device 7 is mounted, is bonded with solder 6.

Examples of the material for the metal plate 11 include Cu, Ni, Pd, Sn, Au, Ag, and the like. Since the composite layer 2 contains the dispersion material 4, the soldering properties of the composite layer 2 are generally poor. The soldering properties, however, can be improved by bonding the metal plate 11 onto the surface of the composite layer 2 as mentioned above, and cracking and peeling due to thermal stress can be prevented at the soldering portion. In the case where the metal matrix 5 of the composite layer 2 is made of Al or an Al alloy, the composite substrate is particularly preferred to be constructed as shown in FIG. 12.

The metal plate 11 used herein may be a single plate or a composite plate consisting of at least two layers formed of the aforementioned materials, depending on the requirements.

The bonding of the composite layer 2 and the metal plate 11 is performed as follows. A porous molded product formed of the dispersion material 4 and the metal plate 11 are laminated and placed in a mold. Thereafter, a metal matrix melt for the composite layer is supplied and casted under pressure according to a melt-casting method. In this way, the mass production of the composite substrate 1 having high bonding properties can be attained at a low cost, compared to the method in which a metal film is plated on the surface of the composite layer 2.

When the composite layer 2 is bonded to the metal plate 11 by pressure casting of the metal matrix, it is better to form fine projections and depressions on the surface of the metal plate 11 facing the composite layer 2. The projections and depressions contribute to increasing the bonding area of the metal plate 11 to the composite layer 2, improving the bonding strength between them.

The thickness of the metal plate 11 is preferably from 0.5 to 2 mm. The thickness of less than 0.5 mm is not preferable because distortion of the metal plate 11 or vanishing of the metal plate 11 by diffusion may take plate depending on the material used as the metal plate, when the composite layer is formed by pressure casting such as melt-casting. On the other hand, if the metal plate 11 has a thickness more than 2 mm, the metal plate 11 will have a large influence upon the thermal expansion properties of the composite substrate 1. Consequently, the thermal stress between the metal plate 11 and the substrate 8 having poor thermal expansion properties cannot be sufficiently matched to each other.

In FIG. 12, the same reference numerals are used to designate the same structural members corresponding to those in FIG. 1. Any further explanation is omitted since the structural members and materials used herein and modifications excluding those mentioned above are the same as those of Embodiment 1. Note that the composite substrate 1 as shown in FIG. 2 may be used herein. In addition, the heat-generating semiconductor device 7 may be directly soldered onto the surface of the metal plate 11.

Embodiment 10

FIG. 13 is a schematic view of a composite substrate on which a heat-generating semiconductor device is to be mounted, and a semiconductor apparatus composite substrate. In this embodiment, a metal plate 11 having good soldering properties and formed in the form of an island or a band is provided onto the surface region of the composite layer 2 on which the substrate 8 (having poor thermal expansion properties) provided with a heat-generating semiconductor device 7, is to be mounted. The same reference numerals are used to designate the same structural members corresponding to those in Embodiment 9 (FIG. 12). Any further explanation is omitted since the structural members and materials used herein and modifications excluding those mentioned above are the same as those of Embodiment 9.

Embodiment 11

FIG. 14 is a schematic view of a composite substrate on which a heat-generating semiconductor device is to be mounted, and a semiconductor apparatus provided with the composite substrate. In this embodiment, a metal plating film 12 is formed on the surface of a metal plate 11 facing to a composite layer 2 to increase the bonding strength to the composite layer 2.

The bonding of the composite layer 2 to the metal plate 11 is performed as follows. A porous molded product of the dispersion material 4 and the metal plate 11 are laminated and placed in a mold. Thereafter, a metal matrix melt for the composite layer is supplied and casted under pressure according to a melt casting method. In this case, if the metal matrix 5 is formed of Al or an Al-alloy, it is preferable that the metal plating film 12 be formed to improve the bonding strength to the metal plate 11. The same reference numerals are used to designate the same structural members corresponding to those in Embodiment 9 shown in FIG. 12. Any further explanation is omitted since the structural members and materials used herein and modifications excluding those mentioned above are the same as those of Embodiment 9.

Hereinbelow, Examples of the present invention will be specifically described based on the Embodiments mentioned above.

EXAMPLE 1

As the dispersion materials, used were following fibers: a SiC fiber (average diameter: 0.3 $\mu$m, average length: 90 $\mu$m), a $9Al_2O_3.2B_2O_3$ fiber (average diameter: 0.5 $\mu$m, average length: 30 $\mu$m), and an AlN fiber (average diameter: 1 $\mu$m, average length: 30 $\mu$m). Then, molded products of porous fiber having volume filling ratios (Vf) of 40%, 50%, and 60% were prepared for each of the aforementioned fibers. The dimensions of the molded products of the porous fiber were 100 mm×100 mm×5 mm. Each of the molded products was placed in a cavity of a pressure casting machine. Casting was made by using an Al matrix melt and a Cu matrix melt. In this manner, composite substrates for the heat-generating semiconductor device were obtained which comprise a composite layer (including a metal matrix in which a fiber with poor thermal expansion properties was dispersed) and a metal layer (formed of a metal alone) arranged in the thickness direction.

After completion of the composite substrates, samples were taken from the composite layers. The samples were heated at a heating rate of 50° C./min. The thermal expansion coefficients and thermal conductivities of the samples were measured until the samples reached 150° C. The results are shown in Table 1 below. For comparison, thermal expansion coefficients and thermal conductivities of Al, Cu, 99% alumina, and Forstellite are shown in Table 2 below.

TABLE 1

| Dispersed material (%) | Vf | Matrix | Thermal expansion coefficient × $10^{-6}/°$ C. | Heat conductivity W/(m · K) 100° C. |
|---|---|---|---|---|
| Sic fiber | 40 | Al | 7.0 | 225 |
| | 50 | Al | 6.5 | 220 |
| | 60 | Al | 5.2 | 217 |
| | 40 | Cu | 5.8 | 390 |
| | 50 | Cu | 5.1 | 386 |
| | 60 | Cu | 4.2 | 381 |
| $9Al_2O_3 \cdot 2B_2O_3$ fiber | 40 | Al | 7.1 | 210 |
| | 50 | Al | 6.6 | 205 |
| | 60 | Al | 5.8 | 200 |
| | 40 | Cu | 6.7 | 384 |
| | 50 | Cu | 5.9 | 375 |
| | 60 | Cu | 4.7 | 368 |
| AlN fiber | 40 | Al | 7.1 | 223 |
| | 50 | Al | 6.7 | 219 |
| | 60 | Al | 5.7 | 215 |
| | 40 | Cu | 6.7 | 386 |
| | 50 | Cu | 5.9 | 380 |
| | 60 | Cu | 4.7 | 377 |

TABLE 2

| Substrate material | Thermal expansion coefficient × $10^{-6}/°C$ | Heat conductivity W/(m·K) 100° C. |
|---|---|---|
| Al | 22.0 | 230 |
| Cu | 17.0 | 393 |
| 99% alumina | 6.8 | 30 |
| Forstellite | 10.5 | 8 |

From the results shown in Tables 1 and 2, it was found that the composite layers of the composite substrates of the present invention have almost the same thermal expansion properties as that of alumina and heat conductivities close proximate to those of Al and Cu.

Semiconductor apparatuses were formed by bonding a semiconductor device with solder onto the surface of the composite layer of a SiC (60 Vf %)/Al substrate and $9Al_2O_3 \cdot 2B_2O_3$ (60 Vf %)/Al substrate. The semiconductor apparatuses thus formed were subjected to a thermal stress test by changing temperatures. The temperature of semiconductor devices were allowed to rise from the normal temperature to about 180° C. and then cooled to normal temperature. This was defined as a single thermal-stress cycle. Evaluation was made on the basis of how many times thermal stress cycles were required until the deterioration took place at the bonding portion of structural members and at the structural members themselves. The results are shown in Table 3 below.

For comparison, the same thermal stress test was repeated with respect to conventional semiconductor apparatuses using an alumina/Cu/Al composite substrate, a Forstellite/Cu/Al composite substrate, and a SiC/Cu/Al substrate. The results are shown together in Table 3. In the conventional composite substrates, a ceramic board (alumina etc.) and a Cu board were bonded with solder. The Cu board and an Al board (for heat sink) were bonded with a heat conducting grease.

TABLE 3

| Substrate composition | Degraded portion | Thermal stress cycles |
|---|---|---|
| SiC (60 Vf %)/Al | Interface between semiconductor device and composite layer | 5000 |
| $9Al_2O_3 \cdot 2B_2O_3$ (60 Vf %)/Al | Interface between semiconductor device and composite layer. | 4900 |
| alumina/Cu/Al | Interface between alumina and Cu | 2200 |
| Forstellite/Cu/Al | Interface between forsterite and Cu | 2100 |
| SiC/Cu/Al | Interface between Si and Cu | 3000 |

As is apparent from Table 3, in the semiconductor apparatus of Example 1, deterioration such as cracking rarely takes place at the interface between layers. Therefore, high reliability can be ensured, compared to the conventional semiconductor apparatuses.

EXAMPLE 2

As the dispersion materials, used were Cu-16.7 wt % Zn-7.1 wt % Al alloy (shape-memory alloy) particles, Ni-50 wt % Ti alloy (shape-memory alloy) particles, and Fe-36 wt % Ni alloy (Invar alloy) particles. As a material for the metal matrix, Al particles (a purity of 99.7%), Cu particles (a purity of 99.99%) were used. Each of the particles had 100 mesh size.

In the case where the shape-memory alloy particles were used as the dispersion material, the alloy particles were annealed in a hydrogen atmosphere for one hour at 500° C. In the case of the Invar alloy particles, they were subjected to the next step without any treatment. Each of the dispersion materials and the material for the matrix were added so as to contain the dispersion material in a volume filling ratio of 10, 20 and 30%. The resultant mixture was blended by use of a ball mill. The mixed powder thus obtained was then molded with pressure into a disk form (88 mm diameter and 30 mm thickness. The molded disks were housed and layered in an aluminum-alloy (AA1070) tube (90 mm inner-diameter, 100 mm outer diameter, and 1180 mm length). Then, both ends of the aluminum alloy tube were covered with the same material by means of electron-beam welding in vacuum. In this manner, a billet was obtained.

The billet thus obtained was heated at 350° C. for 30 minutes and extruded, thereby forming a band-like extrusion-molded product (10 mm-thick and 50 mm-width). After outer layer made of an AA1070 alloy was removed, the band was cut into pieces of 1200 mm in length. The band piece was rolled until the thickness of the board piece became 1.7 mm. Through the steps in the foregoing, a composite board was obtained comprising a metal matrix and particles with poor thermal expansion properties dispersed therein.

Thereafter, the composite board was set in a cavity of a pressure casting machine. Pressure casting was applied to one of the surfaces of the resultant composite board using an Al melt (in the case of Al metal matrix) or a Cu melt (in the case of a Cu metal matrix). In this manner, a composite substrate comprising a composite layer and a metal layer arranged in the thickness direction was obtained in the case where Invar-alloy particles were used as the dispersion material. In the case where the shape-memory alloy particles were used as the dispersion material, the composite substrate was further subjected to heat treatment for imparting shape memory to the alloy particles. The composite substrate was then subjected to cold rolling according to the cross rolling method to reduce the thickness by 0.08%. In this way, a substrate partially having a composite portion was obtained.

Samples were taken from the composite layer of the composite substrates thus obtained. The thermal expansion coefficients and the thermal conductivities of the samples were measured under the same conditions as those of Example 1. The results are shown in Table 4 below. For comparison, the thermal expansion coefficients and thermal conductivities were measured with respect to a W-15 wt % Cu alloy, an Al-30 wt % Si alloy, and Kovar. The results are shown together in Table 5.

TABLE 4

| Dispersed material | Vf (%) | Matrix | Thermal expansion coefficient × $10^{-6}/°$ C. | Heat conductivity W/(m · K) 100° C. |
|---|---|---|---|---|
| Cu - 16.7 wt % | 10 | Al | 5.3 | 220 |
| Zn - 7.1 wt % | 20 | Al | 4.8 | 215 |
| Al particles | 30 | Al | 4.2 | 206 |
|  | 10 | Cu | 5.1 | 388 |
|  | 20 | Cu | 4.3 | 379 |
|  | 30 | Cu | 3.4 | 370 |
| Ni - 50 wt % | 10 | Al | 5.0 | 205 |
| Ti particles | 20 | Al | 4.2 | 200 |
|  | 30 | Al | 4.0 | 195 |
|  | 10 | Cu | 5.2 | 380 |
|  | 20 | Cu | 4.1 | 369 |
|  | 30 | Cu | 3.1 | 361 |
| FN - 36 wt % | 10 | Al | 5.0 | 203 |
| Ni particles | 20 | Al | 4.0 | 199 |
|  | 30 | Al | 3.8 | 189 |
|  | 10 | Cu | 4.6 | 379 |
|  | 20 | Cu | 3.9 | 358 |
|  | 30 | Cu | 3.3 | 347 |

TABLE 5

| Substrate material | Thermal expansion coefficient × $10^{-6}/°$ C. | Heat conductivity W/(m · K) 100° C. |
|---|---|---|
| W - 15 wt % Cu | 7.2 | 183 |
| Al - 30 wt % Si | 22.0 | 138 |
| Koval | 5.3 | 17 |

From the results shown in Tables 4 and 5, it is found that the composite layers of the composite substrates have lower thermal expansion coefficients and higher thermal conductivities than those of the conventional substrate.

Thereafter, a semiconductor device was bonded with solder onto the surface on the composite layers of Cu—Zn—Al (20 Vf %)/Al substrate and Ni—Ti (20Vf %)/Al substrate, Fe—Ni (20Vf %)/Al substrate. The semiconductor apparatuses thus formed were subjected to the thermal stress test under the same conditions as in Example 1. The results are shown in Table 6 below.

TABLE 6

| Substrate composition | Degraded portion | Thermal stress cycles |
|---|---|---|
| Cu-Zn-Al (20 Vf %)/Al | Interface between semiconductor device and composite layer | 5400 |
| Ni-Ti (20 Vf %)/Al | Interface between semiconductor device and composite layer | 5900 |
| Fe-Ni (20 Vf %)/Al | Interface between semiconductor device and composite layer | 4600 |

As described in the above, in the semiconductor apparatus of this example, deterioration such as cracking rarely takes place at the interface between layers. Therefore, it is possible to obtain the semiconductor apparatus having reliability higher than the conventionally used ones shown in Table 3.

EXAMPLE 3

As the dispersion materials, used were a mixed material of a SiC fiber (average diameter: 0.3 $\mu$m, average length: 90 $\mu$m) and a C fiber (average diameter: 40 $\mu$m, average length: 400 $\mu$m); a mixed material of a $9Al_2O_3 \cdot 2B_2O_3$ fiber (average diameter: 0.5 $\mu$m, average length: 30 $\mu$m) and AlN particles (particle size: about 50 $\mu$m); a mixed material of an AlN fiber (average diameter: 1 $\mu$m, average length: 30 $\mu$m) and $ZrO_2$ particles (particle size: about 50 $\mu$m). Then, porous fiber molded-products having volume filling ratios (Vf) of 30%, 40%, and 50% were prepared for each of mixed 30% materials. The dimensions of the porous molded products were 100 mm×100 mm×5 mm.

Each of the molded products was set in a cavity of a pressure casting machine. Casting was made by using Al and Cu matrix melts. In this manner, composite substrates for the heat-generating semiconductor device were obtained which comprise a composite layer (consisting of a metal matrix and a fiber with poor thermal expansion properties dispersed in the metal matrix) and a metal layer (formed of a metal alone) arranged in the thickness direction.

After completion of the composite substrates, samples were taken from of the composite layers. The thermal expansion coefficients and thermal conductivities of the samples were measured under the same conditions as in Example 1. The results are shown in Table 7 below.

TABLE 7

| Dispersed material 1 | Dispersed material 2 | Dispersed material 2 Vf % | Matrix | Thermal expansion coefficient × $10^{-6}/°$ C. | Heat conductivity W/(m · K) 100° C. |
|---|---|---|---|---|---|
| Sic fiber (20 Vf %) | C fiber | 10 | Al | 6.8 | 220 |
|  |  | 20 | Al | 5.5 | 214 |
|  |  | 30 | Al | 4.2 | 206 |
|  |  | 10 | Cu | 5.5 | 380 |
|  |  | 20 | Cu | 4.1 | 373 |
|  |  | 30 | Cu | 3.2 | 361 |
| $9Al_2O_3 \cdot 2B_2O_3$ fiber (20 Vf %) | AlN particles | 10 | Al | 7.0 | 210 |
|  |  | 20 | Al | 5.6 | 205 |
|  |  | 30 | Al | 4.8 | 200 |
|  |  | 10 | Cu | 5.7 | 388 |
|  |  | 20 | Cu | 4.9 | 379 |
|  |  | 30 | Cu | 3.7 | 371 |
| AlN fiber (20 Vf %) | $ZrO_2$ particles | 10 | Al | 6.5 | 223 |
|  |  | 20 | Al | 5.6 | 215 |
|  |  | 30 | Al | 4.5 | 210 |
|  |  | 10 | Cu | 5.7 | 380 |
|  |  | 20 | Cu | 4.2 | 375 |
|  |  | 30 | Cu | 3.9 | 360 |

From the results shown in Tables 7 and 2, it is found that the composite layers of the composite substrates of the present invention have almost the same thermal expansion properties as that of alumina and heat conductivity close proximate to those of Al and Cu.

Then, semiconductor apparatuses were formed by bonding a semiconductor device with solder onto the surface on the composite layer of a SiC (20 Vf %)+C (20 Vf %)/Al substrate and a $9Al_2O_3 \cdot 2B_2O_3$ (20 Vf %)+AlN(20 Vf %)/Al substrate. The semiconductor apparatuses thus formed were subjected to the thermal stress test under the same conditions as in Example 1. The results are shown in Table 8 below.

TABLE 8

| Substrate composition | Degraded portion | Thermal stress cycles |
|---|---|---|
| SiC (20 Vf %) + C (20 Vf %)/Al | Interface between semiconductor device | 5600 |

TABLE 8-continued

| Substrate composition | Degraded portion | Thermal stress cycles |
|---|---|---|
| 9Al$_2$O$_3$ . 2B$_2$O$_3$ (20 Vf %) + AlN (20 Vf %)/Al | and composite layer Interface between semiconductor device and composite layer | 4200 |

As is apparent from Table 8, in the semiconductor apparatuses of this example, deterioration such as cracking rarely takes place at the interface between layers. Therefore, the semiconductor apparatuses can acquire reliability higher than the conventional semiconductor apparatuses shown in Table 3.

EXAMPLE 4

As the dispersion materials, used were a SiC fiber (average diameter: 0.3 μm, average length: 90 μm), a 9Al$_2$O$_3$.2B$_2$O$_3$ fiber (average diameter: 0.5 μm, average length: 30 μm), and an AlN fiber (average diameter: 1 μm, average length: 30 μm). Then, porous fiber molded products having volume filling ratios (Vf) of 40%, 50%, and 60% were prepared for each of the aforementioned fibers. The dimensions of the porous molded products were 100 mm×100 mm×5 mm. Each of the porous molded products was placed in a cavity (having the same shape as the moldings) of a pressure casting machine. Casting was made by using Al—Si7% and Al matrix melts. In this manner, composite boards were obtained comprising a metal matrix in which a fiber with poor thermal expansion properties was dispersed.

Each of the composite board thus formed was subjected to pretreatment with an alkaline solution (sodium hydroxide) for 70 seconds at 50° C. With this pretreatment, oil components on the surface were removed and thereby the surface of the composite board was modified. Thereafter, a Zn underlying layer (1 to 2 μm thick) was provided onto the resultant board by zincate treatment. On the surface of the Zn underlying layer, Ni was plated at normal temperature and with a current density of 4A/cm$^2$, thereby forming a Ni-plated layer (metal film) of 10 μm thick on the surface of the composite board. On the Ni-plated composite board, a DBC substrate (70 mm×70 mm×1.2 mm) having a heat-generating semiconductor device mounted thereon, was bonded with an eutectic solder. In this manner, semiconductor apparatuses (Nos. 1 to 18) were formed.

For comparison, semiconductor apparatuses (Nos. 19–36) were formed by bonding the DBC substrate having a heat-generating semiconductor device mounted thereon, to a composite board having no Ni-plating.

The semiconductor apparatuses thus formed were subjected to the thermal stress test by changing temperatures. The semiconductor apparatuses were cooled from the normal temperature to −40° C., heated to +125° C., and cooled again to normal temperature. This was defined as a single thermal stress cycle. Deterioration at the bonding portions or structural members themselves was checked after 300 times of thermal stress were given, Furthermore, heat resistivities of the semiconductor apparatuses were examined. The results are shown in Table 9 below.

The heat resistivity was measured by providing thermo couple to the upper surface of the DBC substrate and the lower surface of the composite board, permitting the semiconductor apparatus to generate a predetermined output power, and measuring the difference in temperature between both surfaces.

TABLE 9

| Sample No. | Dispersed material | Matrix | Vf | Measuring time | Heat resistance | Peeling, Crack examination |
|---|---|---|---|---|---|---|
| 1 | SiC | Al—Si 7% | 40 | Before test | 0.07 | — |
| 2 | | | 50 | | 0.09 | — |
| 3 | | | 60 | | 0.12 | — |
| 4 | | | 40 | After test | 0.07 | None |
| 5 | | | 50 | | 0.09 | None |
| 6 | | | 60 | | 0.11 | None |
| 7 | 9Al$_2$O$_3$.2B$_2$O$_3$ | Al | 40 | Before test | 0.08 | — |
| 8 | | | 50 | | 0.10 | — |
| 9 | | | 60 | | 0.11 | — |
| 10 | | | 40 | After test | 0.08 | None |
| 11 | | | 50 | | 0.10 | None |
| 12 | | | 60 | | 0.11 | None |
| 13 | AlN | Al—Si 7% | 40 | Before test | 0.07 | — |
| 14 | | | 50 | | 0.09 | — |
| 15 | | | 60 | | 0.12 | — |
| 16 | | | 40 | After test | 0.07 | None |
| 17 | | | 50 | | 0.09 | None |
| 18 | | | 60 | | 0.11 | None |
| 19 | SiC | Al—Si 7% | 40 | Before test | 0.07 | — |
| 20 | | | 50 | | 0.08 | — |
| 21 | | | 60 | | 0.13 | — |
| 22 | | | 40 | After test | 0.40 | Cracks: periphery of solder |
| 23 | | | 50 | | 0.77 | Cracks: periphery of solder |
| 24 | | | 60 | | 1.00 | Peeling: disconnection of solder-bonding portion |
| 25 | 9Al$_2$O$_3$.2B$_2$O$_3$ | Al | 40 | Before test | 0.09 | — |
| 26 | | | 50 | | 0.12 | — |
| 27 | | | 60 | | 0.13 | — |
| 28 | | | 40 | After test | 0.45 | Cracks: periphery of solder |
| 29 | | | 50 | | 0.83 | Peeling & partial connection portions |
| 30 | | | 60 | | 1.30 | Peeling: disconnection of solder-bonding portion |
| 31 | AlN | Al—Si 7% | 40 | Before test | 0.08 | — |
| 32 | | | 50 | | 0.13 | — |
| 33 | | | 60 | | 0.15 | — |
| 34 | | | 40 | After test | 0.42 | Cracks: periphery of solder |
| 35 | | | 50 | | 0.83 | Peeling & partial connection portions |
| 36 | | | 60 | | 1.04 | Peeling: disconnection of solder-bonding portion |

From Table 9, it is found that composite boards with Ni-plating (Sample Nos. 1 to 18) have good soldering properties to the DBC substrate with rare occurrence of peeling and cracking due to thermal stress in the soldering portions.

In this example, the thermal resistance between the composite board and the DBC substrate, and the presence and absence of peeling and cracking were checked by use of a composite board with no metal layer in place of the composite substrate of the present invention. However, if the same test was performed by using the composite substrate of the present invention, the same results as those of this example will be obtained as to the thermal resistance between the composite layer and the DBC substrate. This results will be fit in Example 5.

EXAMPLE 5

Using a C (carbon) fiber (average diameter: 10 μm, average length: 200 μm) as the dispersion material, porous fiber molded products having volume filling ratios of 40%, 50%, and 60%, were prepared. The dimensions of the porous molded products were 100 mm×100 mm×5 mm. Each of these porous molded products was set in a cavity (having the same shape as that of the molding) of a pressure casting machine. Pressure casting of each of the porous molded products was performed by using Al—Si (7%) matrix melt. In this way, composite boards were prepared comprising a metal matrix in which the C fiber having poor thermal expansion properties is dispersed.

On each of the surfaces of the composite boards thus manufactured, a plating layer (metal film) of Cu, Ni, Pd, Sn, Au or Ag was formed in a thickness of 5 μm.

A DBC substrate (70 mm×70 mm×0.5 mm) having a heat-generating semiconductor device mounted thereon was bonded on each of the plated composite layers with a generally-used eutectic solder. In this way, semiconductor apparatuses (Sample Nos. 1–18) were manufactured.

For comparison, semiconductor apparatuses (Sample Nos. 19–21) were manufactured by bonding the DBC substrate having a heat-generating semiconductor device, to a composite board with no plating in the similar manner.

The semiconductor apparatuses thus manufactured were subjected to a thermal-stress test. How many times thermal stress cycles were required until deterioration (cracking and peeling) took place at the soldering interface, was checked. In the thermal stress test, the semiconductor device was cooled from the normal temperature to −40° C., heated to +180° C., and cooled again to normal temperature. This was defined as a single thermal stress cycle. Evaluation was made on the basis of how many times the thermal stress cycles were required until deterioration at the bonding portion of structural members structural members themselves. The results in Table 10 below.

TABLE 10

| Sample No. | Dispersed material | Matrix | Vf (%) | Plated layer | Thermal stress cycles |
|---|---|---|---|---|---|
| 1 | C | Al-Si 7% | 40 | Cu | 2000 |
| 2 | | | | Ni | 3600 |
| 3 | | | | Pd | 3400 |
| 4 | | | | Sn | 2500 |
| 5 | | | | Au | 2800 |
| 6 | | | | Ag | 2800 |
| 7 | | | 50 | Cu | 2500 |
| 8 | | | | Ni | 3400 |
| 9 | | | | Pd | 3900 |
| 10 | | | | Sn | 3100 |
| 11 | | | | Au | 3000 |
| 12 | | | | Ag | 3050 |
| 13 | | | 60 | Cu | 3000 |
| 14 | | | | Ni | 3950 |
| 15 | | | | Pd | 4300 |
| 16 | | | | Sn | 3600 |
| 17 | | | | Au | 3200 |
| 18 | | | | Ag | 3300 |

TABLE 10-continued

| Sample No. | Dispersed material | Matrix | Vf (%) | Plated layer | Thermal stress cycles |
|---|---|---|---|---|---|
| 19 | C | Al-Si 7% | 40 | None | 1500 |
| 20 | | | 50 | None | 1800 |
| 21 | | | 60 | None | 2000 |

Apparent from the results shown in Table 10, the plated composite layers of the semiconductor apparatuses (Sample Nos. 1–18) exhibit rather better soldering properties to the DBC substrate having a heat-generating semiconductor device mounted thereon. Furthermore, cracking and peeling due to thermal stress rarely take place at the soldering portion.

It should be noted that deterioration took place in lower thermal stress cycles in Example 5 than in Example 1 (Table 3), Example 2 (Table 6) and Example 3 (Table 8). This is presumably because that test conditions of Example 5 are stringent.

EXAMPLE 6

In this Example, there will be explained a composite substrate on which a heat-generating semiconductor device is to be mounted and a method of manufacturing a semiconductor apparatus employing the composite substrate, with reference to FIG. 8.

As the dispersion materials, used were a SiC fiber (average diameter: 0.3 μm, average length: 90 μm), a $9Al_2O_3 \cdot 2B_2O_3$ fiber (average diameter: 0.5 μm, average length: 30 μm), and an AlN fiber (average diameter: 1 μm, average length: 30 μm). Then, porous fiber molded products having a volume filling ratio (Vf) of 40% were prepared for each of the aforementioned fibers. The dimensions of the porous molded products were 100 mm×100 mm×5 mm. Each of the porous molded products was set in a cavity (having the same shape as the molded products) of a pressure casting machine. Pressure-casting was made by using an Al-Si7% matrix melt. In this manner, composite boards were prepared comprising a metal matrix in which a fiber with poor thermal expansion properties was dispersed.

Each of the composite boards 2 thus formed was subjected to pretreatment with an alkaline solution (sodium hydroxide) for 70 seconds at 50° C. In the pretreatment, the surface of the composite board was modified by removing oil components therefrom. Thereafter, a Zn underlying layer (1 to 2 μm thick) was formed on the resultant board by zincate treatment. On the surface of the Zn underlying layer, Ni was plated at normal temperature and with a current density of 4A/cm², thereby forming a Ni-plated layer 9 (metal film) of 10 μm thick on one surface of the composite board 2.

Further on the other surface of Ni-plated composite board, a metal plate (Al—Si 7%) 3 serving as a heat sink was bonded with Si—Zn solder 10 (0.2 mm thick). In this manner, a composite substrate was formed. On the Ni-plated layer 9 of the composite substrate, a DBC substrate 8 (70 mm×70 mm×1.2 mm) having a heat-generating semiconductor device mounted thereon, was bonded with an eutectic solder 6. In this way, a semiconductor apparatus 1 was manufactured.

EXAMPLE 7

In this Example, there will be explained a composite substrate on which a heat-generating semiconductor device is to be mounted and a method of manufacturing a semiconductor apparatus employing the composite substrate, with reference to FIG. 9.

As the dispersion materials, used were a SiC fiber (average diameter: 0.3 μm, average length: 90 μm) and a C fiber (average diameter: 10 μm, average length: 200 μm). Then, porous molded products having a volume filling ratio (Vf) of 40% were prepared for each of the aforementioned fibers. The dimensions of the porous molded products were 100 mm×100 mm×5 mm. Each of the porous molded products was set in a cavity (having the same shape as the molded products) of a pressure casting machine. Pressure-casting was made by using Al—Si22 wt % matrix melt. In this manner, the composite board 2 was prepared comprising a metal matrix in which a fiber with poor thermal expansion properties was dispersed.

To one surface of the composite board 2 thus manufactured, Ni was plated in the same manner as in Example 6, thereby forming a Ni plated layer (metal film) of 10 μm thick. Onto the other surface of the composite board 2, 100 cylindrical pieces 3a (which correspond to a metal layer) made of Al having 5 mm in diameter and 25 mm in length were bonded almost uniformly. The composite board 2 was bonded to the cylindrical pieces 3a as follows:

A thin plate coated with a flux made of brazing material (BA4045) of 7 mm diameter was set at a predetermined surface position of the composite board 2 at which a metal layer is to be connected. Thereafter, cylindrical members 3a were aligned on the thin plate, and then, about 2 kg weight was mounted on the cylindrical members 3a.

Then, the resultant structure was allowed to stand in a furnace maintained at 595° C. for 10 minutes, thereby forming a metal layer 3a consisting of cylindrical members. Through the steps mentioned above, the composite substrate was manufactured. Thereafter, a DBC substrate 8 having a heat-generating semiconductor device mounted thereon, was bonded onto the composite substrate with an eutectic solder. In this manner, a semiconductor apparatus was manufactured.

EXAMPLE 8

As the dispersion materials, used were a SiC fiber (average diameter: 0.3 μm, average length: 90 μm), a $9Al_2O_3 \cdot 2B_2O_3$ fiber (average diameter: 0.5 μm, average length: 30 μm), an AlN fiber (average diameter: 1 μm, average length: 30 μm), and a C fiber (average diameter: 20 μm, average length: 70 μm). Then, porous molded products having volume filling ratios (Vf) of 40%, 50%, and 60% were prepared for each of the aforementioned fibers. The dimensions of the porous molded products were 100 mm×100 mm×5 mm. As the metal plate having good soldering properties, a Cu plate (100 mm×10 mm×1 mm) was prepared.

The porous molded products and the metal plate were previously heated in a preheating furnace to 700° C. Argon was used as the inner atmosphere of the furnace in consideration of oxidative deterioration of the metal plate. As shown in FIG. 15, the preheated metal plate 11 was laminated with a porous molded products 4P. The laminated construct was set in a casting mold 13 which has been preheated at 250° C. After clamping was made by a melt-casting method using a pressure casting apparatus, an Al—Si7% alloy melt of 750° C. was supplied by way of an inlet 14 at a rate of 10 cm/second. After the resultant mixture was allowed to stand for 1 minutes under a pressure of 1000 atm, it was solidified. In this manner, the composite substrates 1 were manufactured comprising a metal plate 11, a composite layer 2, and a metal layer 3 (heat sink portion) arranged in the thickness direction (shown in FIG. 12). In the same manner, the composite substrates (Sample Nos. 1–12) on which a heat-generating semiconductor device is to be mounted, were prepared.

Subsequently, each of the obtained composite substrates was cut and the interface between the metal plate 11 and the composite layer 2 was observed with an optical microscope. As a result, it was confirmed that the bonding conditions of the interfaces were satisfactory.

For comparison, composite substrates (Sample Nos. 13–24) were manufactured which is a composite layer 2 plated with Cu by an electrical plating method.

The composite substrates thus formed were subjected to a thermal shock test. In the thermal shock test, two atmospheres were prepared: one is a heating atmosphere of 200° C. and the other is a cooling atmosphere of −30° C. Each of the composite substrates was alternately placed in these atmospheres. A heating and cooling cycle was defined as a single thermal shock. Evaluation was made on the basis of how many times thermal shock were required until breakage took place at the interface between the composite layer and the metal plate, or between the composite layer and the Cu plated layer. The breakage was detected by measuring electric resistivity. To be more specific, when the resistivity increased by 20% from the initial value, it was determined that the breakage occurred and then, the composite substrate was cut and the conditions of the broken interface were checked. The results are shown in Table 11 below.

From the results shown in Table 11, it was found that the composite substrate having a Cu plate bonded thereto exhibits better bonding properties between layers than that plated with Cu.

TABLE 11

| Sample No. | Dispersed material | Matrix | Vf (%) | Surface of composite layer | Thermal stress cycles |
|---|---|---|---|---|---|
| 1 | SiC | Al-Si 7% | 40 | Bonding of Cu plate | 200 |
| 2 | | | 50 | | 350 |
| 3 | | | 60 | | 460 |
| 4 | $9Al_2O_3 \cdot 2B_2O_3$ | | 40 | | 180 |
| 5 | | | 50 | | 280 |
| 6 | | | 60 | | 390 |
| 7 | AlN | | 40 | | 220 |
| 8 | | | 50 | | 360 |
| 9 | | | 60 | | 430 |
| 10 | C | | 40 | | 270 |
| 11 | | | 50 | | 300 |
| 12 | | | 60 | | 470 |
| 13 | SiC | Al-Si 7% | 40 | Electrolytic Cu plating | 100 |
| 14 | | | 50 | | 130 |
| 15 | | | 60 | | 190 |
| 16 | $9Al_2O_3 \cdot 2B_2O_3$ | | 40 | | 90 |
| 17 | | | 50 | | 150 |
| 18 | | | 60 | | 170 |
| 19 | AlN | | 40 | | 120 |
| 20 | | | 50 | | 180 |
| 21 | | | 60 | | 200 |
| 22 | C | | 40 | | 110 |
| 23 | | | 50 | | 170 |
| 24 | | | 60 | | 195 |

EXAMPLE 9

As the dispersion material, a C fiber (average diameter: 10 μm, average length: 200 μm) was used. Then, a porous fiber molded product having a volume filling ratio (Vf) of 40% was prepared using the C fiber. The dimensions of the porous molded product were 100 mm×100 mm×5 mm. As the metal plate having good soldering properties, a Ni plate, Pd plate, Au plate, and Ag plate (dimensions: 100 mm×100 mm×1 mm) were prepared. Onto one surface of each of the metal plate, Cu was plated by means of electrolytic-plating in a thickness of 10 μm in order to increase a bonding strength to the composite layer.

The porous molded product and the metal plates were previously heated in a preheating furnace to 700° C. Argon was used as the inner atmosphere of the furnace in consideration of oxidative deterioration of the metal plate. Each of the preheated metal plates was laminated with the porous fiber molding in such a manner in which the Cu plated surface of the metal plate faces the porous molded product. The laminated construct was set in a casting mold 13 preheated to 250° C. After the clamping was performed by a melt-casting method using a pressure casting apparatus, an Al—Si7% alloy melt of 750° C. was supplied to the molding at a rate of 10 cm/second. After the resultant mixture was allowed to stand for 1 minutes under a pressure of 1000 atm, it was solidified. In this manner, the composite substrates 1 were manufactured comprising a metal plate 11, a Cu plated layer 12, a composite layer 2, and a metal layer 3 (heat sink portion) arranged in the thickness direction (shown in FIG. 14). In the same manner, the composite substrates (Sample Nos. 1–3) on which a heat-generating semiconductor substrate is to be mounted, were prepared.

For comparison, composite substrates (Sample Nos. 4–6) were manufactured in the same manner as mentioned above using a metal plate without Cu plating.

The composite substrates were subjected to the same thermal shock test as in Example 7. The results are shown in Table 12 below. From the results shown in Table 12, it was found that the composite substrate plated with Cu (the Cu plating is provided on the surface of the metal plate, facing the composite layer), exhibits good bonding properties between layers than that having no Cu-plated metal plate.

TABLE 12

| | Dispersed material | Matrix | Vf (%) | Metal plate | Thermal shock cycles |
|---|---|---|---|---|---|
| 1 | C | Al-Si 7% | 40 | Cu plated Ni plate | 280 |
| 2 | | | | Cu plated Pd plate | 300 |
| 3 | | | | Cu plated Au plate | 260 |
| 4 | | | | Cu plated Ag plate | 250 |
| 5 | C | Al-Si 7% | 40 | Ni plate | 120 |
| 6 | | | | Pd plate | 140 |
| 7 | | | | Au plate | 150 |
| 8 | | | | Ag plate | 170 |

As explained in the foregoing, according to the present invention, there is provided a composite substrate on which a heat-generating semiconductor device is to be mounted and a semiconductor apparatus, the composite substrate having good heat dissipation properties with rare occurrence of cracking and peeling at the interface between the composite substrate and the heat-generating semiconductor device, or between the composite substrate and a substrate (with poor thermal expansion properties) having a heat-generating semiconductor device mounted thereon. Therefore, the development of large-scale semiconductor devices and operation of the semiconductor device with high power can be realized by the present invention.

Additional advantages and modifications will readily occur to those skilled in the art. Therefore, the invention in its broader aspects is not limited to the specific details, and representative embodiments shown and described herein. Accordingly, various modifications may be made without departing from the spirit or scope of the general inventive concept as defined by the appended claims and their equivalents.

What is claimed is:

1. A composite substrate on which a heat-generating semiconductor device is to be mounted, which comprises:
    a composite layer containing a matrix made of a high-thermal-conductivity metal and a fibrous dispersion material formed of a low-thermal-expansion substance contained in said matrix; and
    a metal heat-dissipating layer for dissipating heat through said substrate generated by heat generating semiconductor devices mounted on the substrate, provided onto one entire surface of main surfaces of said composite layer;
    wherein (i) either one of a heat-generating semiconductor device and a low-thermal-expansion substrate provided with a heat-generating semiconductor device, is to be mounted on another main surface of said composite layer; (ii) said metal layer and said matrix form a continuous phase; (iii) said metal layer is made of a metal material identical to that used in said matrix; and wherein (iv) fibrous dispersion material which is oriented in the same direction suppresses thermal expansion in said same direction.

2. The composite substrate according to claim 1, wherein said matrix and said metal layer are made of aluminum or an aluminum alloy.

3. The composite substrate according to claim 1, wherein said matrix and said metal layer are made of copper or a copper alloy.

4. The composite substrate according to claim 1, wherein projections and depressions are provided to a surface of said metal layer not facing said composite layer, in order to improve heat dissipation properties.

5. The composite substrate according to claim 1, wherein a volume filling ratio of a dispersion material contained in said composite layer is highest at a surface of said composite layer and decreases toward the inside thereof.

6. The composite substrate according to claim 1, wherein an insulating layer is provided onto said another main surface of said composite layer.

7. A semiconductor apparatus comprising either one of a heat-generating semiconductor device and a low-thermal-expansion substrate provided with a heat-generating semiconductor device, is mounted on another main surface of the composite layer of the composite substrate according to claim 1.

* * * * *

UNITED STATES PATENT AND TRADEMARK OFFICE
CERTIFICATE OF CORRECTION

PATENT NO. : 5,981,085
DATED      : November 11, 1999
INVENTOR(S) : Ninomiya et al.

It is certified that error appears in the above-identified patent and that said Letters Patent is hereby corrected as shown below:

On the title page, item [73], "Inc." should read -- LTD.--.

Signed and Sealed this

First Day of August, 2000

Attest:

Q. TODD DICKINSON

Attesting Officer

Director of Patents and Trademarks